US012724064B2

(12) United States Patent
Lou et al.

(10) Patent No.: US 12,724,064 B2
(45) Date of Patent: Sep. 1, 2026

(54) WAFER TEST CASSETTE, WAFER TEST SYSTEM AND WAFER TEST METHOD

(71) Applicant: XINGR TECHNOLOGIES (ZHEJIANG) LIMITED, Yiwu City (CN)

(72) Inventors: Choon Leong Lou, Singapore (SG); Ho Yeh Chen, Zhubei City (TW)

(73) Assignee: XINGR TECHNOLOGIES (ZHEJIANG) LIMITED, Yiwu City (CN)

(*) Notice: Subject to any disclaimer, the term of this patent is extended or adjusted under 35 U.S.C. 154(b) by 145 days.

(21) Appl. No.: 18/621,861

(22) Filed: Mar. 29, 2024

(65) Prior Publication Data

US 2025/0093406 A1 Mar. 20, 2025

(30) Foreign Application Priority Data

Sep. 15, 2023 (CN) ......................... 202311197186.X
Dec. 29, 2023 (CN) ......................... 202311865887.6

(51) Int. Cl.
*G01R 31/10* (2006.01)
*G01R 1/04* (2006.01)
(Continued)

(52) U.S. Cl.
CPC ....... *G01R 31/2875* (2013.01); *G01R 1/0416* (2013.01); *G01R 1/07342* (2013.01);
(Continued)

(58) Field of Classification Search
CPC ........... G01R 31/2831; G01R 31/2862; G01R 31/2863; G01R 31/2868; G01R 31/2874;
(Continued)

(56) References Cited

U.S. PATENT DOCUMENTS 6,265,888 B1 7/2001 Hsu
8,158,017 B2 * 4/2012 Hudson ............ H01J 37/32972
216/60

(Continued)

FOREIGN PATENT DOCUMENTS

CN 112782438 A 5/2021
JP 106758 A 1/1998

(Continued)

OTHER PUBLICATIONS

Korean Patent Office, Notice of Allowance issued on Feb. 19, 2026 for KR application No. 10-2024-0124072.

*Primary Examiner* — Thang X Le
(74) *Attorney, Agent, or Firm* — Li & Cai Intellectual Property (USA) Office

(57) ABSTRACT

A wafer test cassette, a wafer test system, and a wafer test method are provided. The wafer test cassette includes a first housing including a first magnetic member, a second housing including a second magnetic member corresponding to the first magnetic member, a first fluid port, and a gas supply device. The first housing and the second housing are tightly coupled to each other by which a test space is defined. The first housing includes a probe card, and the second housing carries a wafer. When the first housing and the second housing are coupled, a probe is electrically in contact with a pad of the wafer. The first fluid port is disposed in the first housing or the second housing, and receives an external gas to the test space. After the test space receives the external gas, an air pressure value thereof is greater than an atmospheric pressure.

13 Claims, 9 Drawing Sheets

(51) Int. Cl.

| | |
|---|---|
| ***G01R 1/073*** | (2006.01) |
| ***G01R 1/16*** | (2006.01) |
| ***G01R 31/28*** | (2006.01) |

(52) U.S. Cl.

CPC ........... *G01R 1/16* (2013.01); *G01R 31/2831* (2013.01); *G01R 31/2862* (2013.01); *G01R 31/2863* (2013.01); *G01R 31/2868* (2013.01); *G01R 31/2891* (2013.01)

(58) Field of Classification Search

CPC ............ G01R 31/2875; G01R 31/2877; G01R 31/2886; G01R 31/2891; G01R 1/16; G01R 1/0416

See application file for complete search history.

(56) References Cited

U.S. PATENT DOCUMENTS

| | | | | |
|---|---|---|---|---|
| 10,790,122 | B2 * | 9/2020 | Hong | H01J 37/32642 |
| 2003/0122568 | A1 * | 7/2003 | Eldridge | G01R 31/2831 324/754.07 |
| 2003/0155882 | A1 * | 8/2003 | Ono | G03F 7/709 318/649 |
| 2007/0069759 | A1 | 3/2007 | Rzepiela et al. | |
| 2016/0054375 | A1 * | 2/2016 | Yamada | G01R 31/2891 324/750.2 |
| 2021/0255219 | A1 * | 8/2021 | Cho | G01R 1/07364 |
| 2023/0014966 | A1 * | 1/2023 | Snow | G01R 31/2877 |

FOREIGN PATENT DOCUMENTS

| | | | |
|---|---|---|---|
| JP | 2004198186 | A | 7/2004 |
| JP | 200693706 | A | 4/2006 |
| JP | 4162058 | B2 | 10/2008 |
| JP | 2011142090 | A | 7/2011 |
| JP | 2011252792 | * | 12/2011 |
| JP | 2011252792 | A | 12/2011 |
| JP | 201489105 | A | 5/2014 |
| JP | 2018105725 | A | 7/2018 |
| JP | 2020115115 | A | 7/2020 |
| JP | 20217149 | A | 1/2021 |
| JP | 2021007149 | * | 1/2021 |
| JP | 202134399 | A | 3/2021 |
| KR | 1020070078991 | A | 8/2007 |
| KR | 1020120104405 | A | 9/2012 |
| KR | 101805446 | B1 | 12/2017 |
| KR | 1020210157324 | A | 12/2021 |
| KR | 1020220061545 | A | 5/2022 |
| KR | 1020230027090 | A | 2/2023 |

* cited by examiner

WAFER TEST CASSETTE, WAFER TEST SYSTEM AND WAFER TEST METHOD

CROSS-REFERENCE TO RELATED PATENT APPLICATION

This application claims the benefit of priorities to China Patent Application Nos. 202311197186.X, filed on Sep. 15, 2023, and 202311865887.6, filed on Dec. 29, 2023, in the People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a wafer test, and more particularly to a wafer test cassette, a wafer test system and a wafer test method whereby a corona discharge can be suppressed.

BACKGROUND OF THE DISCLOSURE

When an integrated circuit is designed for a wafer, the wafer is subjected to a burn-in test and an electrical test. Conventionally, for the burn-in test and a reliability test, each wafer is tested individually using a tester and a probe card. Each wafer is placed on a carrier and electrically contacted by the probes of the probe card to perform the test. Therefore, when the amount of wafers increases, more testers and probe cards are required, causing the test process to be time-consuming and increasing equipment costs.

In the conventional technology, in order to improve the efficiency of the burn-in test, a composite test unit system has been developed to allow the burn-in test on several wafers to be simultaneously performed. Such a system includes multiple test units for the wafers to be respectively configured therein. Further, each test unit includes at least one chuck configured to fix the wafer, and wafer is connected to the tester for the burn-in test or the electrical test.

For another thing, a wafer test cassette has been developed recently, in which the probe card and the wafer are pre-positioned and configured in the wafer test cassette, and the wafer test cassette is directly and electrically connected to the tester. In addition, the wafer test cassette is disposed in the test unit for the burn-in test or the electrical test. Conventionally, the upper housing and the lower housing of the wafer test cassette are combined by means of engagement or vacuum. Adoption of the engagement means for the combination of the upper housing and the lower housing may have limited fixation effect, and may cause problems with uneven force application and defamation. Further, during the test process, high voltage is applied to the probe card, resulting in an increased corona discharge, which may often cause damage to the probe card or the wafer.

Therefore, how to improve the effectiveness of the wafer test cassette through structural design improvement, to overcome the above issues has become one of the important issues to be addressed in the related field.

SUMMARY OF THE DISCLOSURE

In response to the above-referenced technical inadequacies, the present disclosure provides a wafer test cassette, which includes a first housing, second housing, a first fluid port, and a gas supply device. The first housing includes a first magnetic member. The second housing includes a second magnetic member, and the second magnetic member is arranged corresponding to the first magnetic member so as to enable the first housing and the second housing to be tightly coupled to each other by which a test space is defined. The first housing includes a probe card, and the second housing is configured to carry a wafer. When the first housing and the second housing are coupled to each other, at least one probe is configured to be in contact with at least one pad of the wafer. The first fluid port is disposed on the first housing or the second housing, and configured to receive an external gas to the test space. The gas supply device has a first fluid path connected to the first fluid port, and the gas supply device is configured to supply the external gas to the test space through the first fluid path. After the test space receives the external gas, an air pressure value of the test space is greater than an atmospheric pressure.

In one of the possible or preferred embodiments, the external gas includes an inert gas.

In one of the possible or preferred embodiments, magnetic attraction between the first magnetic member and the second magnetic member is determined according to the air pressure value of the test space.

In one of the possible or preferred embodiments, the magnetic attraction between the first magnetic member and the second magnetic member increases with an increase of the air pressure value, such that a pin pressure caused by an electrical contact between the at least one probe and the at least one pad of the wafer is unchanged.

In one of the possible or preferred embodiments, the first housing is magnetically connected to a test end, and the second housing is magnetically connected to a carrier seat.

In one of the possible or preferred embodiments, the wafer test cassette further includes a switching device disposed between the first fluid port and the gas supply device, and the switching device is configured to enable the external gas to enter the test space or release from the test space through the first fluid path.

In one of the possible or preferred embodiments, the wafer test cassette further includes a second fluid port disposed on the first housing or the second housing and connected to the gas supply device. The second fluid port is configured to enable the external gas to enter the test space or release from the test space.

In one of the possible or preferred embodiments, the gas supply device has a second fluid path connected to the second fluid port.

In one of the possible or preferred embodiments, each of the first fluid port and the second fluid port is configured to enable the external gas to enter the test space or release from the test space, or one of the first fluid port and the second fluid port is configured to enable the external gas to enter the test space and another of the first fluid port and the second fluid port is configured to enable the external gas to release from the test space.

In one of the possible or preferred embodiments, after a test process is performed by applying the probe card of the wafer test cassette to test the wafer, the external gas is configured to be released, and the first housing and the second housing are released from a tightly coupled state.

In one of the possible or preferred embodiments, the wafer test cassette further includes a seal member disposed between the first housing and the second housing and arranged around the test space.

In order to solve the above-mentioned problems, another one of the technical aspects adopted by the present disclosure is to provide a wafer test system, which includes the wafer test cassette, a discharge transducer, and a pressure transducer. The discharge transducer is disposed at a side of the first housing or a side of the second housing, and configured to detect whether or not a corona discharge occurs on the at least one probe. The pressure transducer is configured to detect the air pressure value of the test space.

In one of the possible or preferred embodiments, the wafer test system further includes a control circuit correspondingly connected to the discharge transducer and the pressure transducer.

In order to solve the above-mentioned problems, yet another one of the technical aspects adopted by the present disclosure is to provide a wafer test method, which includes a detection step, a monitoring step, and a control step. In the detection step, an air pressure value of a test space in a wafer test cassette during a test process being performed is detected. In the monitoring step, a probe in the wafer test cassette is monitored for a corona discharge. In the control step, the air pressure value in the test space is maintained or increased according to a result of the monitoring step.

Therefore, in the wafer test cassette, the wafer test system, and the wafer test method provided by the present disclosure, by virtue of adjusting the magnetic attraction and increasing the air pressure of the injected inert gas (in particular, increasing the air pressure in the wafer test cassette to more than or even a number of times the external air pressure), the corona discharge occurrence in the test process can be significantly reduced so as to minimize damage to the probes, thereby reducing test costs.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
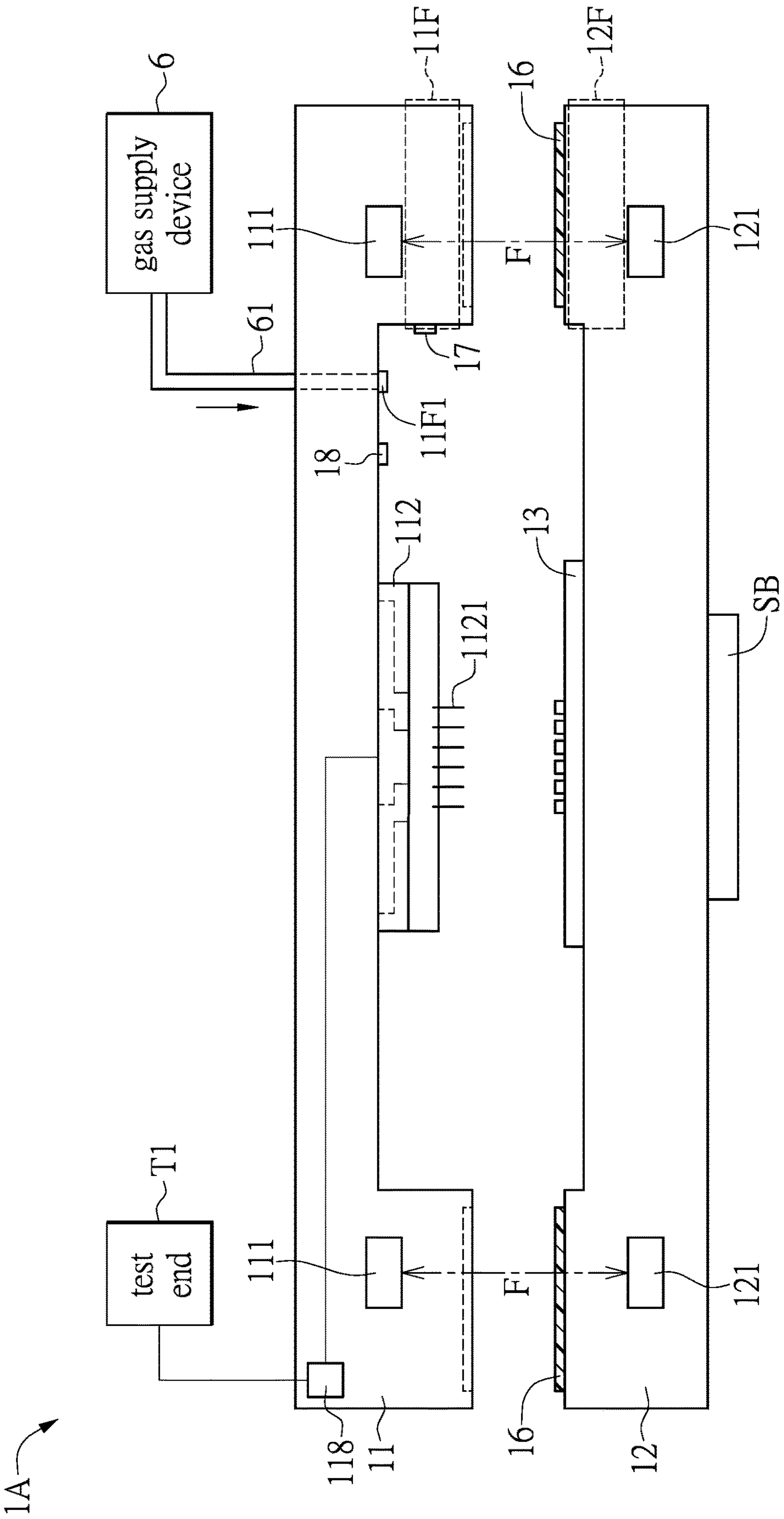
FIG. 1 is a schematic view of a wafer test cassette according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Embodiments

Figure 2:
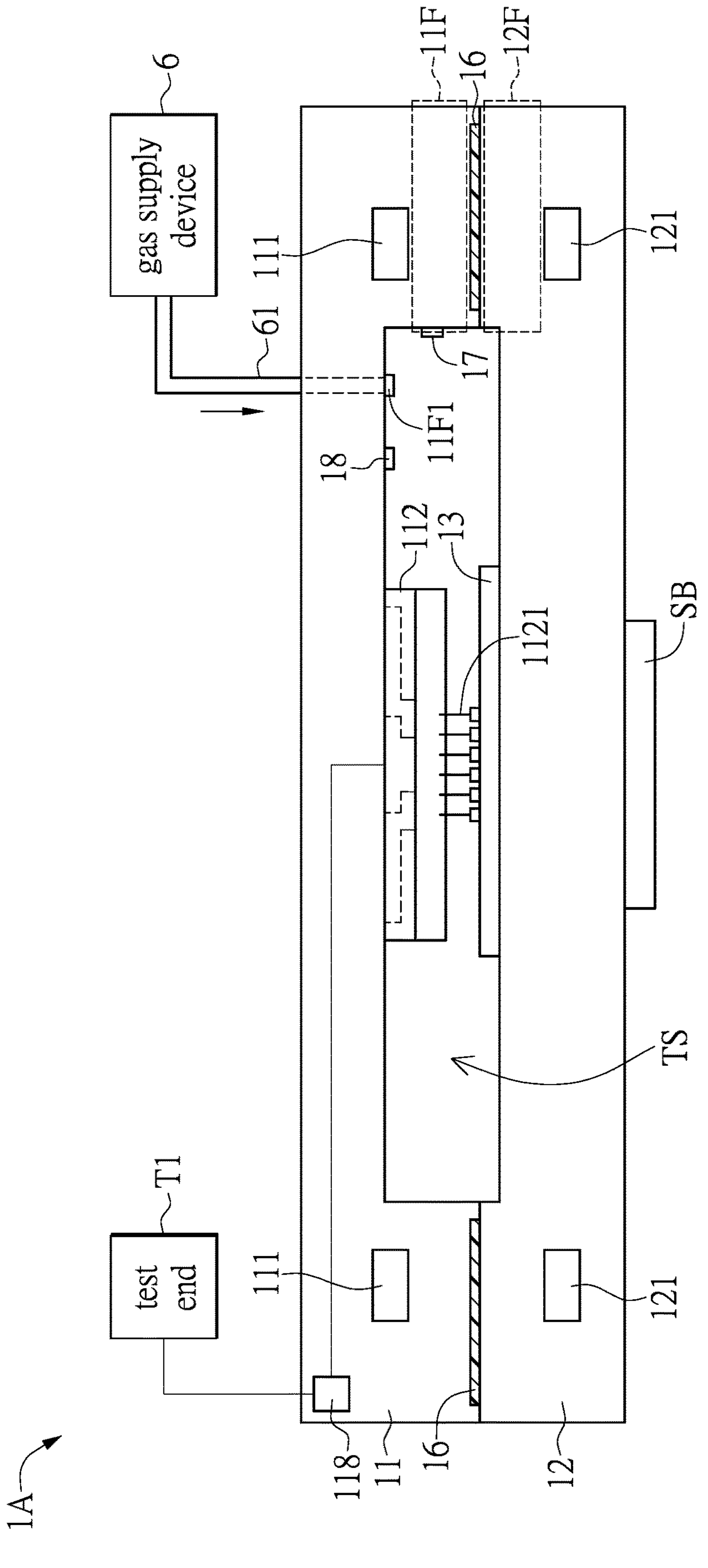
FIG. 2 is another schematic view of the wafer test cassette according to the first embodiment of the present disclosure.

Referring to FIG. 1 and FIG. 2, FIG. 1 is a schematic view of a wafer test cassette according to a first embodiment of the present disclosure, and FIG. 2 is another schematic view of the wafer test cassette according to the first embodiment of the present disclosure.

A wafer test cassette 1A includes a first housing 11 and a second housing 12. The first housing 11 includes a first magnetic member 111, and the second housing 12 includes a second magnetic member 121. In the present embodiment, the wafer test cassette 1A is shown from a side view in FIG. 1 and FIG. 2.

In the present embodiment, a shape of the wafer test cassette 1A can be square, circular, or other shapes, which can be adjusted according to practical requirements, but the present disclosure is not limited thereto.

The first magnetic member 111 is arranged at a periphery the first housing 11, and the second magnetic member 121 is arranged at a periphery of the second housing 12. As shown in FIG. 1 and FIG. 2, the wafer test cassette 1A includes at least one set of the first magnetic member 111 and the second magnetic member 121 that corresponds to each other. Each set of the first magnetic member 111 and the second magnetic member are arranged correspondingly. That is, a position of the first magnetic member 111 arranged in the first housing 11 corresponds to a position of the second magnetic member 12 arranged in the second housing 12.

Referring to FIG. 1, in the present embodiment, the wafer test cassette 1A has a first fluid port 11F1. The first fluid port 11F1 is provided in the first housing 11 or the second housing 12. The first fluid port 11F1 is configured to receive an external gas from an external source to a test space TS.

The first fluid port 11F1 is connected to a gas supply device 6. The gas supply device 6 has a first fluid flow path 61. The first fluid flow path 61 is spatial communicated with the first fluid port 11F1 to allow the gas supply device 6 to supply the external gas to the test space TS.

In the present embodiment, the external gas is ordinary air or an inert gas. The inert gas includes nitrogen, helium, neon, argon, krypton, etc. In certain embodiments, the external gas is a mixture of the inert gases.

Further, after the gas supply device 6 injects the external gas into the test space TS, an air pressure in the test space TS is greater than an external atmospheric pressure.

The injection of the external gas by the gas supply device 6 into the test space TS results in that an internal air pressure in the test space TS is greater than an external air pressure. Accordingly, magnetic attraction between the first magnetic member 111 and the second magnetic member 112 is determined according to an air pressure value of the test space TS. That is, in a case that one of the first magnetic member 111 and the second magnetic member 121 is a permanent magnet, a magnitude of the magnetic attraction between the first magnetic member 111 and the second magnetic member 121 is predetermined according to the air pressure predetermined to be provided in the test space TS.

In a case that one of the first magnetic member 111 and the second magnetic member 121 is a non-permanent magnet, the magnetic attraction between the first magnetic member 111 and the second magnetic member 121 can be increased by a rise in the air pressure value of the test space TS. That is, the air pressure value of the test space TS can be adjusted according to the practical requirements. Accordingly, the magnetic attraction between the first magnetic member 111 and the second magnetic member 121 can also be flexibly adjusted.

In the present embodiment, the first housing 11 is magnetically connected to a test end T1 through an electrical connection port 118, and the second housing 12 is magnetically connected a carrier seat SB.

Further, in the present embodiment, the wafer test cassette 1A includes only one first fluid port 11F1. The external gas supplied by the gas supply device 6 is configured for injection only and may not be discharged through other paths. Therefore, when the first housing 11 and the second housing 12 are separated from each other, the air pressure is naturally released and the external gas injected is naturally dispersed.

The present disclosure also provides a wafer test system, which includes the wafer test cassette 1A and a pressure transducer 18, and the pressure transducer 18 is configured to detect the air pressure in the wafer test cassette 1A (i.e., the test space TS). The wafer test system also includes a discharge transducer 17. The discharge transducer 17 is configured to monitor whether or not a corona discharge occurs on the probe of the wafer test cassette 1A. In certain embodiments, the pressure transducer 18 detects the current air pressure value of the test space TS, and the discharge transducer 17 monitors whether or not the corona discharge occurs in the probe 1121. If no corona discharge occurs, the wafer test system may maintain the current air pressure value of the test space TS. If the corona discharge occurs, the wafer test system may control the wafer test cassette 1A to have the external gas to be injected into the test space TS, so that the air pressure value of the test space TS can suppress the corona discharge in the probe. In certain embodiments, the magnetic attraction between the first housing 11 and the second housing 12 is increased, and the air pressure value in the test space TS is further increased to improve the corona discharge in the prove 1121. In certain embodiments, the wafer test system further includes a control circuit which is correspondingly connected to the discharge transducer 17 and the pressure transducer 18. When the corona discharge occurs, the control circuit can be configured to calculate the air pressure required to suppress the corona discharge and inject the external gas into the test space TS, so as to bring the air pressure value in the test space TS up to the calculated air pressure. The following is further described.

In the present embodiment, the discharge transducer 17 can be a light transducer that transmits monitoring image information or a monitoring signal to an analysis circuit (not shown in the figures) for analysis. The analysis circuit (not shown in the figures) can be configured to analyze the air pressure value as well as properties of the injected inert gas, the test process of the wafer test cassette 1A, conditions as well as probability of corona discharge depending on a voltage of the probe in a preheating process, and other big data through the monitoring image information or the monitoring signal.

Further, a user or a manufacturer can design a magnitude of the magnetic attraction between the first magnetic member 111 and the second magnetic member 121 according to the practical requirements to withstand the air pressure in the wafer test cassette 1A. For example, the magnitude of the magnetic attraction can be adjusted according to an arrangement of the first magnetic member 111 and the second magnetic member 121, materials of the first magnetic member 111 and the second magnetic member 121, numbers of the first magnetic member 111 and the second magnetic member 121, or a case that each of the first magnetic member 111 and the second magnetic member is an electromagnet.

In the present disclosure, the inert gas or nitrogen can be injected into the wafer test cassette 1A so that the air pressure in the wafer test cassette 1A is higher than the pressure of the external environment. In such a way, the corona discharge can be suppressed.

Referring to FIG. 1 and FIG. 2, the first magnetic member 111 and the second magnetic member 121 are respectively disposed in the first housing 11 and the second housing 12. The first housing 11 has a first convex structure 11F extending downwardly from a periphery of the first housing 11. Similarly, the second housing 12 also has a second convex structure 12F extending upwardly from a periphery of the second housing 12. In the present embodiment, the first magnetic member 111 is disposed in the first convex structure 11F, and the second magnetic member 121 is disposed in the second convex structure 12F.

The first convex structure 11F and the second convex structure 12F are arranged correspondingly. When the first housing 11 and the second housing 12 are tightly coupled to each other through a cooperation of the first magnetic member 111 and the second magnetic member 121, the first convex structure 11F and the second convex structure 12F are tightly coupled to each other.

The wafer test cassette 1A includes a seal member 16 disposed between the first convex structure 11F and the second convex structure 12F. The seal member 16 can be an O-ring. The seal member 16 is configured to reinforce airtightness when the first housing 11 and the second housing 12 are coupled to each other. The seal member 16 can be arranged around the test space TS, whereby the test space TS is defined by the first housing 11, the second housing 12, and the seal member 16. In certain embodiments, the seal member 16 can be disposed on the first convex structure 11F or the second convex structure 12F, which can be adjusted according to the practical requirements, but the present disclosure is not limited thereto. When the first housing 11 and the second housing 12 are tightly coupled to each other through the magnetic attraction between the first magnetic member 111 and the second magnetic member 121, the first convex structure 11F of the first housing 11 and the second convex structure 12F of the second housing 12 are tightly coupled to each other through the seal member 16.

Further, in the embodiment shown in FIG. 1, the first housing 11 is also provided with a probe card 112, which includes one or more probes 1121. When the first housing 11 and the second housing 12 are coupled to each other, the one or more probes 1121 project toward the second housing 12. Further, in the present embodiment, the wafer test cassette 1A is also provided with a wafer 13, which is carried by the second housing 12. When the first housing 11 and the second housing 12 are coupled to each other, the one or more probes 1121 project toward the second housing 12 to be abutted against pads of the wafer 13, i.e., test contacts, so that the one or more probes 1121 are correspondingly and electrically connected to the pads of the wafer 13.

The present disclosure does not limit that the first magnetic member 111 and the second magnetic member 121 need to face each other, and the scope of the present disclosure to protect is that as long as the first housing 11 and the second housing 12 can be fixedly coupled to each other through the magnetic attraction generated by the cooperation of the first magnetic member 111 and the second magnetic member 121. In addition, in certain embodiments, one of the first magnetic member 111 and the second magnetic member 121 is the non-permanent magnet, such as the electromagnet, and another of the first magnetic member 111 and the second magnetic member 121 is the permanent magnet or an unmagnetized magnetically permeable object, such as iron, cobalt, and nickel.

In the present embodiment, a number of each of the first magnetic member 111 and the second magnetic member 121 can be multiple, and the number of the first magnetic member 111 is the same as the number of the second magnetic member 121, but the present disclosure does not limit the numbers of the first magnetic member 111 and the second magnetic member 121.

Figure 3:
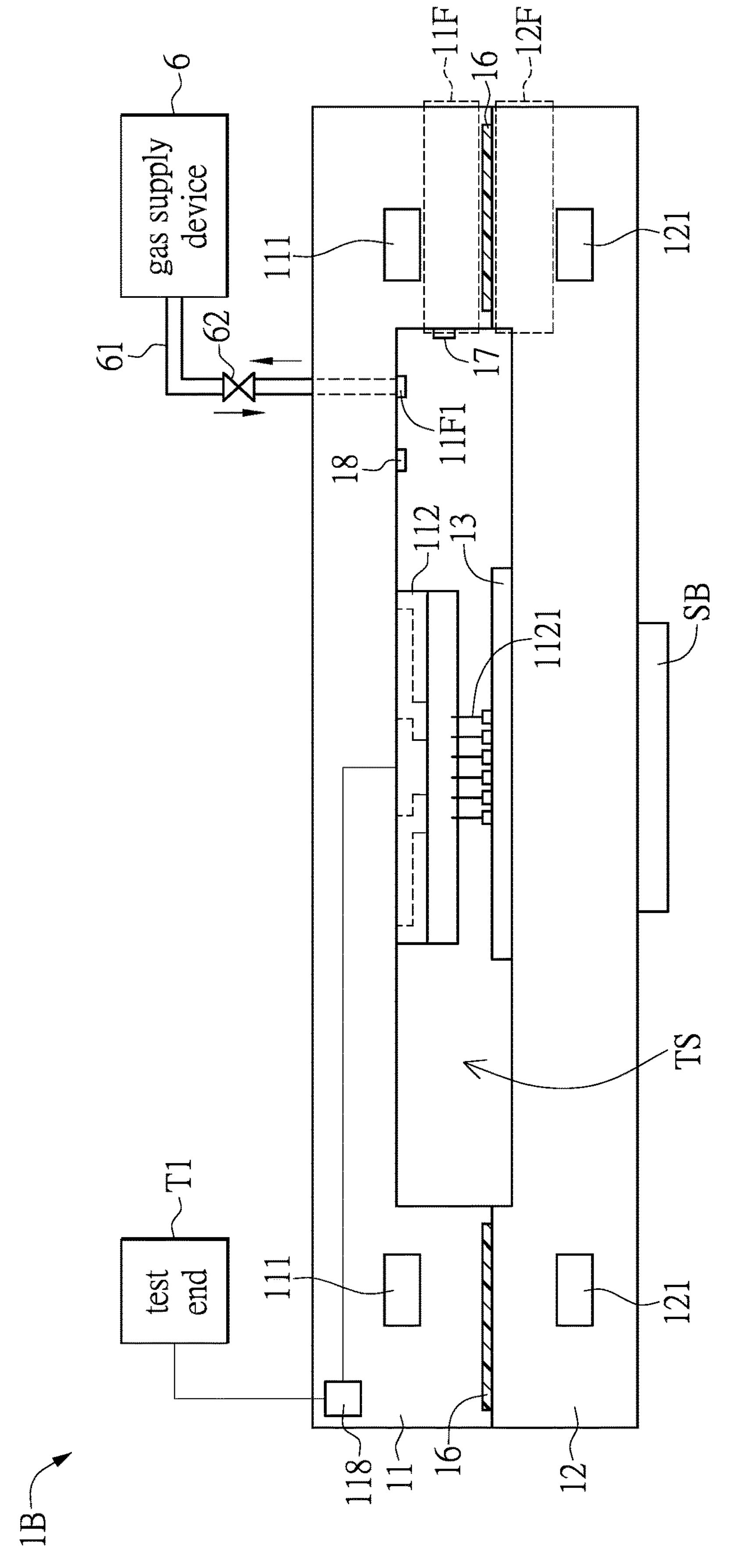
FIG. 3 is a schematic view of a wafer test cassette according to a second embodiment of the present disclosure.

Referring to FIG. 3, FIG. 3 is a schematic view of a wafer test cassette according to a second embodiment of the present disclosure.

A wafer test cassette 1B is similar to the wafer test cassette 1A of the first embodiment, and the differences therebetween are that the gas supply device 6 of the wafer test cassette 1B further includes a switching device 62 connected between the gas supply device 6 and the first fluid port 11F1. In the present embodiment, the switching device 62 is a gas supply/pressure relief switching device, which is a two-way valve. When the gas supply device 6 is configured to supply the external gas, the switching device 62 (e.g., the two-way valve) is switched to a forward direction, i.e., flowing in only. When the test space TS is depressurized, i.e., the gas is released from the test space TS, the switching device 62 (e.g., the two-way valve) is switched to a reverse direction, i.e. flowing out only, but not flowing in. Therefore, a communication direction between the test space TS and the gas supply device 6 can be switched through the switching device 62 so that the air pressure in the test space TS can be increased using the gas supply device 6 to supply the external gas, or the pressure can be relieved by using the gas supply device 6. In the present embodiment, the switching device 62 is connected to a control circuit (not shown in the figures) for switching the communication direction through the control circuit (not shown in the figures).

In certain embodiments, multiple (more than two) first fluid ports 11F1 are provided, and a fluid path connected to at least one of the multiple first fluid ports 11F1 is connected to the switching device 62 (e.g., the two-way valve). The operation of the switching device 62 (e.g., the two-way valve) is as described above.

Figure 4:
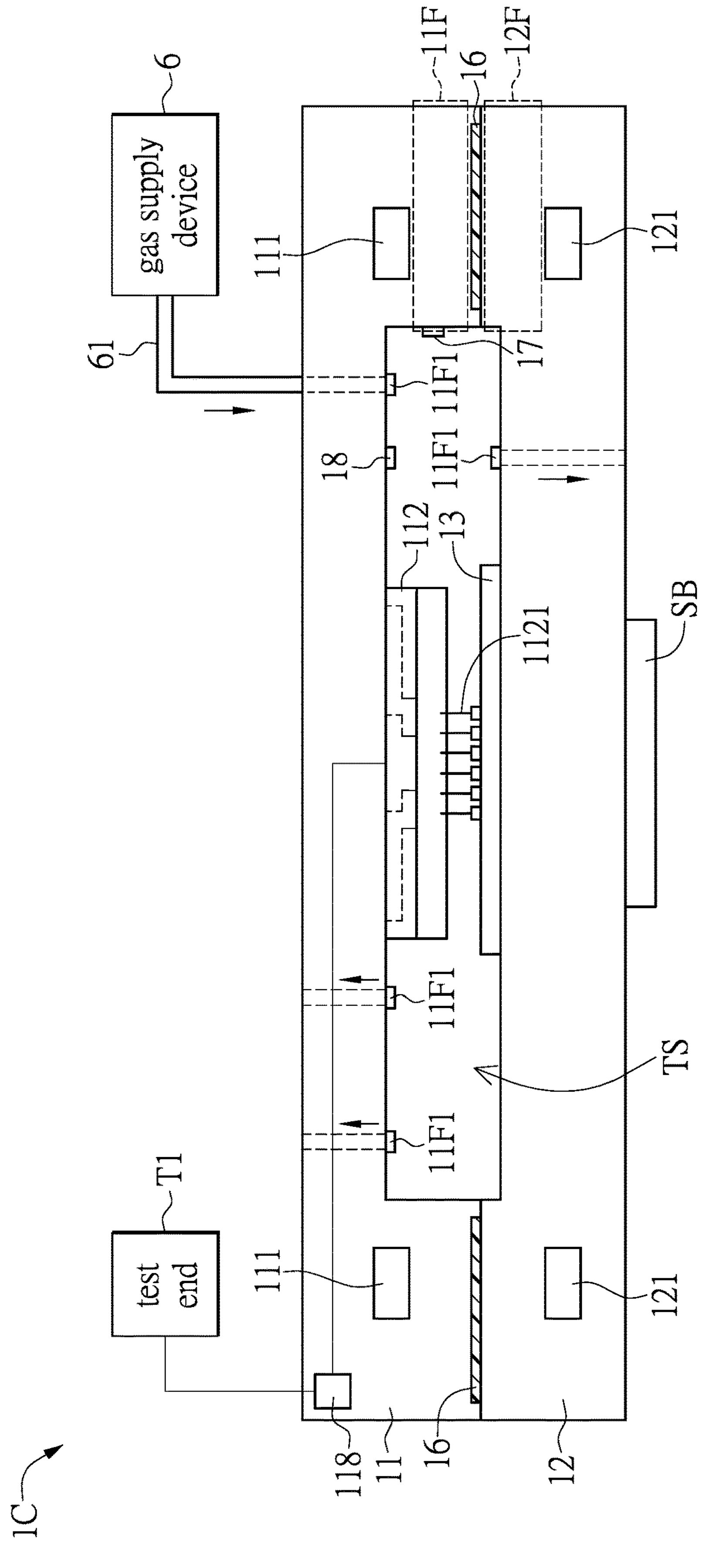
FIG. 4 is a schematic view of a wafer test cassette according to a third embodiment of the present disclosure.

Referring to FIG. 4, FIG. 4 is a schematic view of a wafer test cassette according to a third embodiment of the present disclosure. A wafer test cassette 1C is similar to the wafer test cassette 1A of the first embodiment, and the differences therebetween are that the wafer test cassette 1C includes multiple first fluid ports 11F1 correspondingly disposed on the first housing 1 and/or the second housing 2. Although a number of the first fluid ports 11F1 is two or more, the external gas supplied by the gas supply device 6 is injected to test space TS in a manner the same as that of the wafer test cassette 1A of the first embodiment, i.e., the gas only flows in but not out via the first fluid port 11F1.

Figure 5:
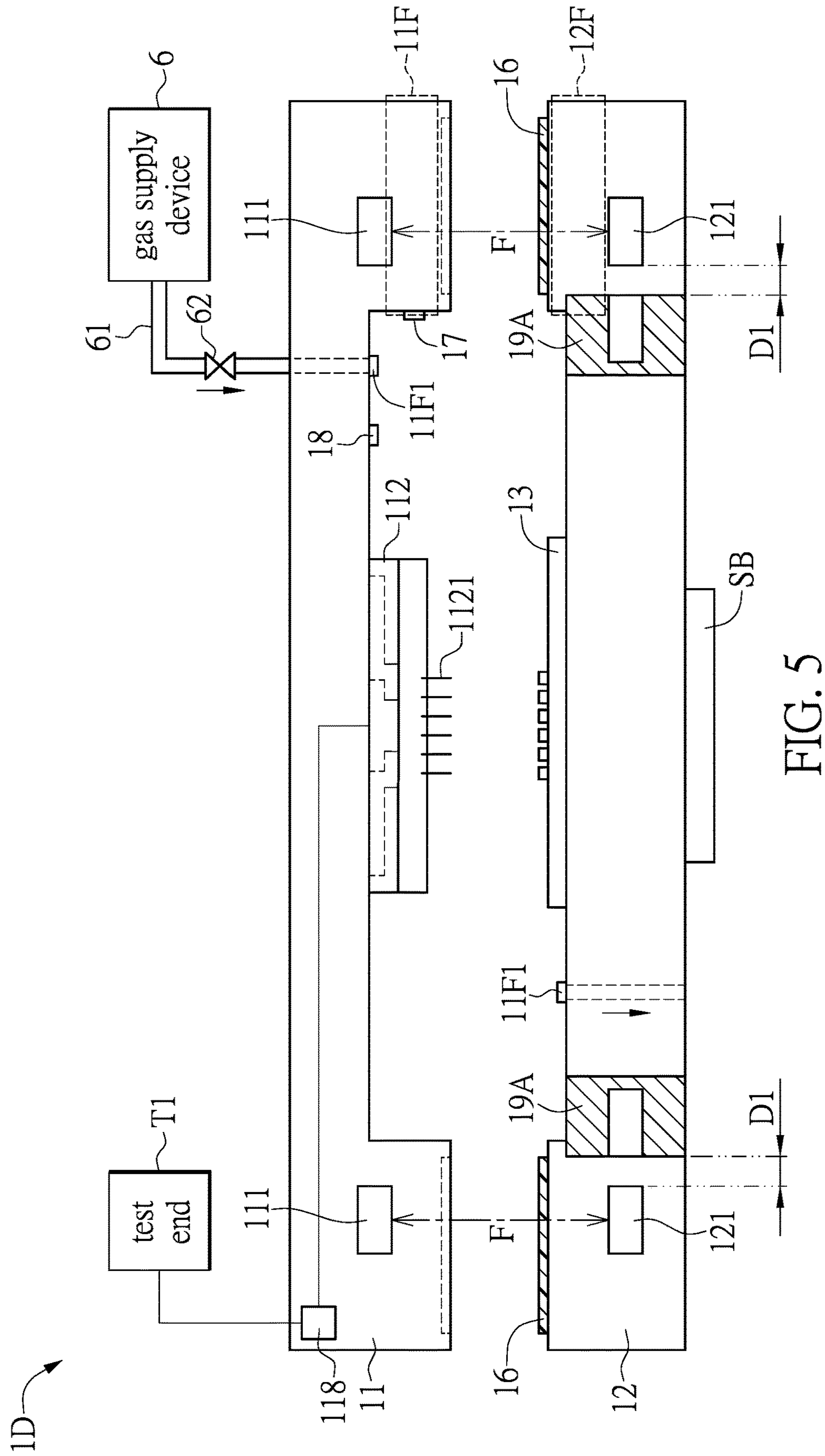
FIG. 5 is a schematic view of a wafer test cassette according to a fourth embodiment of the present disclosure.

Referring to FIG. 5, FIG. 5 is a schematic view of a wafer test cassette according to a fourth embodiment of the present disclosure.

A wafer test cassette 1D is similar to the wafer test cassette 1B of the second embodiment, and the differences therebetween are that the wafer test cassette 1D includes multiple first fluid ports 11F1 correspondingly connected to the gas supply device 6 through the switching device 62.

Similarly, in the present embodiment, the switching device 62 is the gas supply/pressure relief switching device, which is the two-way valve. In one particular embodiment, the switching device 62 is connected to one of the multiple first fluid ports 11F1, and, when the gas supply device 6 is configured to supply the external gas, the switching device 62 (e.g., the two-way valve) is switched to a forward direction, i.e., flowing in only. When the test space TS is depressurized, i.e., the gas is released from the test space TS, the switching device 62 (e.g., the two-way valve) is switched to a reverse direction, i.e. flowing out only, but not flowing in. Therefore, the communication direction between the test space TS and the gas supply device 6 can be switched through the switching device 62 so that the air pressure in the test space TS can be increased using the gas supply device 6 to supply the external gas, or the pressure can be relieved by using the gas supply device 6.

Similarly, the switching device 62 is connected to the control circuit (not shown in the figures) for switching the communication direction through the control circuit (not shown in the figures).

In addition, in the present embodiment, each of the first magnetic member 111 and the second magnetic member 121 is the permanent magnet or the unmagnetized magnetically permeable object. Accordingly, a magnetic barrier assembly 19A can be a magnetic shielding assembly movably disposed in the second housing 12. The magnetic barrier assembly 19A of the present embodiment can also be applied to the wafer test cassettes 1A to 1C of the embodiments described above.

Figure 6:
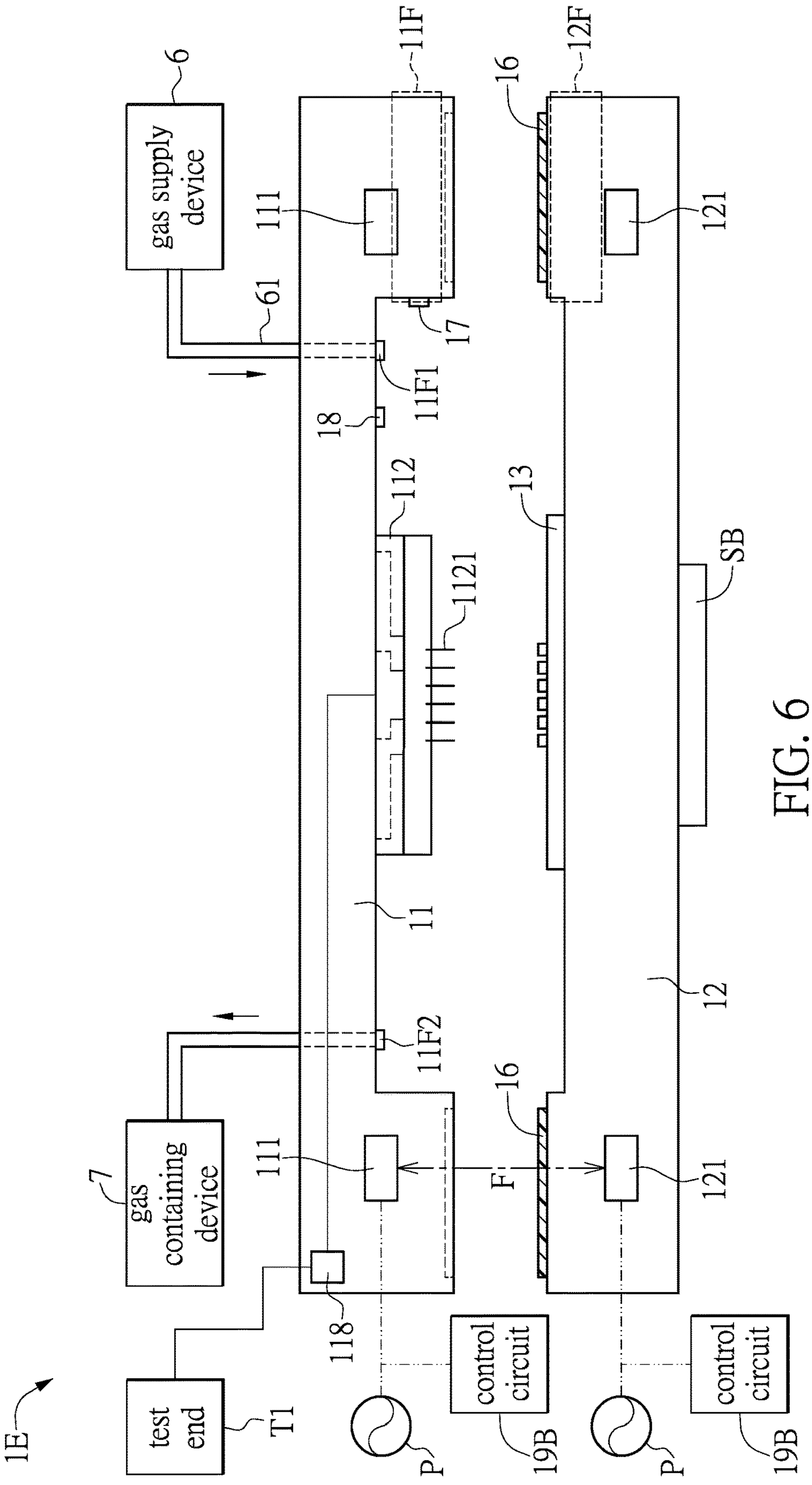
FIG. 6 is a schematic view of a wafer test cassette according to a fifth embodiment of the present disclosure.

Referring to FIG. 6, FIG. 6 is a schematic view of a wafer test cassette according to a fifth embodiment of the present disclosure.

A wafer test cassette 1E of the present embodiment is similar to the wafer test cassette 1A of the first embodiment, and the differences therebetween are that the wafer test cassette 1E includes the first fluid port 11F1 and a second fluid port 11F2.

The first fluid port 11F1 is connected to the gas supply device 6 whereby the gas supplied by the gas supply device 6 can be injected into the test space TS of the wafer test cassette 1E. The second fluid port 11F2 is configured for the depressurization of the test space TS to release the gas in the test space TS.

Further, in the present embodiment, each of the first magnetic member 111 and the second magnetic member 121 is the non-permanent magnet. Accordingly, a magnetic barrier assembly 19B is a control circuit that modulates the magnetic attraction between the first magnetic member 111 and the second magnetic member 121. The magnetic barrier assembly 19B of the present embodiment can also be applied to the wafer test cassettes 1A to 1C of the embodiments described above.

Figure 7:
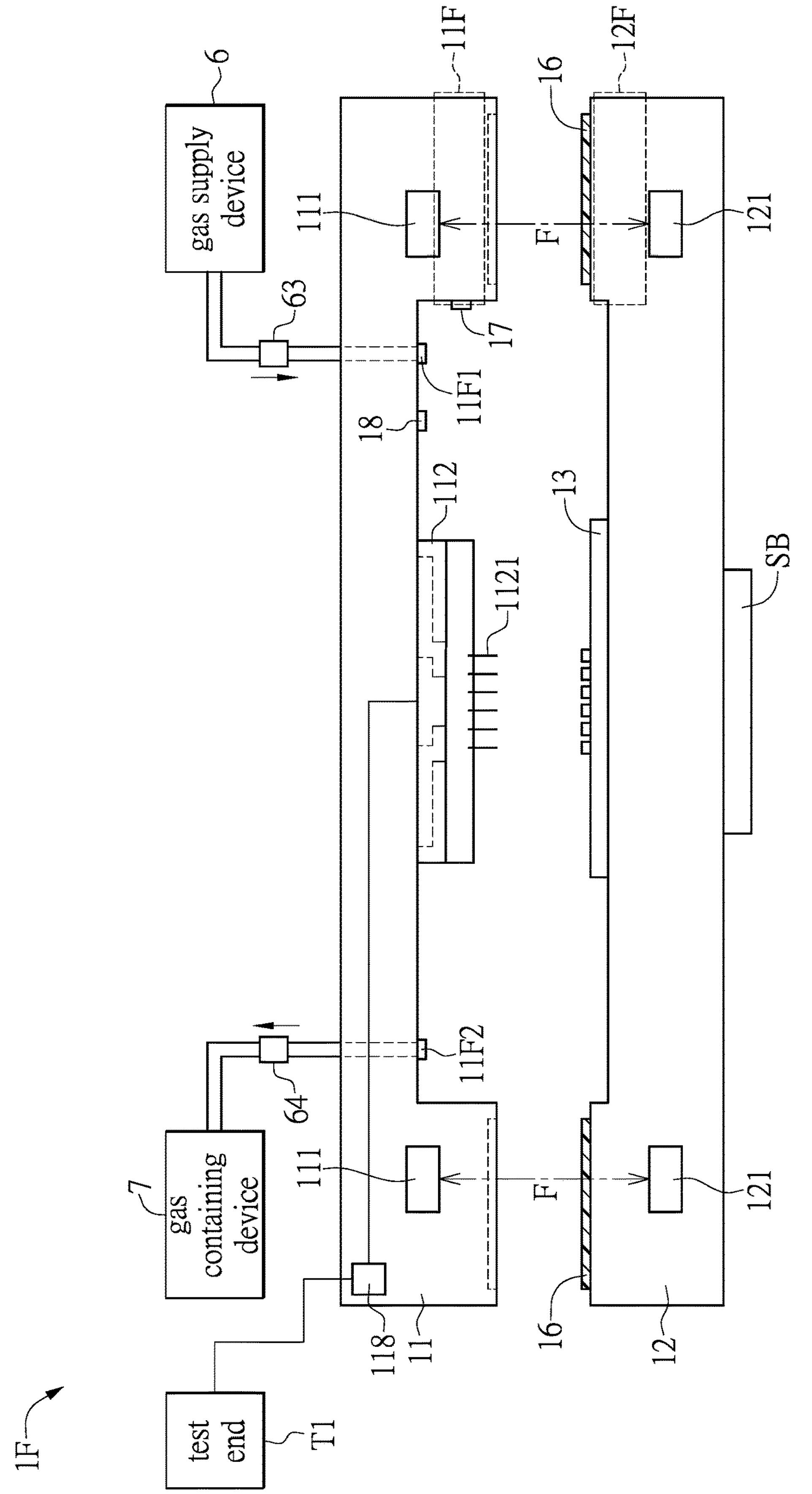
FIG. 7 is a schematic view of a wafer test cassette according to a sixth embodiment of the present disclosure.

Referring to FIG. 7, FIG. 7 is a schematic view of a wafer test cassette according to a sixth embodiment of the present disclosure.

A wafer test cassette 1F of the present embodiment is similar to the wafer test cassette 1E, and the differences therebetween are that the first fluid port 11F1 is connected to the gas supply device 6 through a first one-way switching device 63, and the second fluid port 11F2 is connected to a gas containing device 7 through a second one-way switching device 73.

When the gas supply device 6 is configured to supply the external gas, the first one-way switching device 63 (e.g., a one-way valve) is open. That is, the external gas can only be supplied to the test space TS of the wafer test cassette 1F by the gas supply device 6. In this case, the second one-way switching device 64 (e.g., the one-way valve) is closed.

When the test space TS is depressurized, i.e., the gas is released from the test space TS, the first one-way switching device 63 (e.g., the one-way valve) is closed and the second one-way switching device 64 is open. In this case, the gas in the test space TS can be released into the gas containing device 7.

Figure 8:
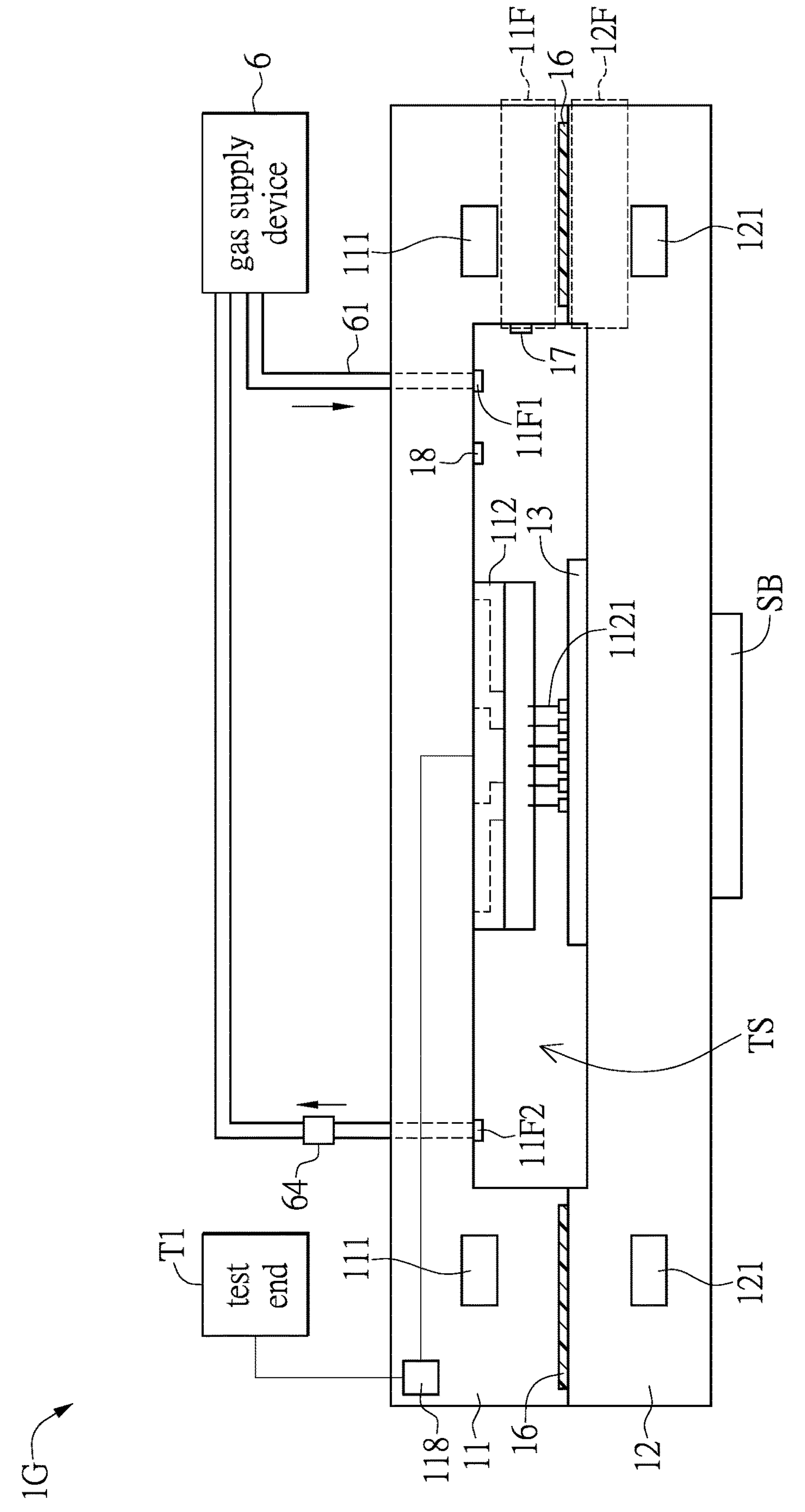
FIG. 8 is a schematic view of a wafer test cassette according to a seventh embodiment of the present disclosure.

Referring to FIG. 8, FIG. 8 is a schematic view of a wafer test cassette according to a seventh embodiment of the present disclosure.

A wafer test cassette 1G of the present embodiment is similar to the wafer test cassette 1E, and the differences therebetween are that the first fluid port 11F1 is connected to the gas supply device 6 through the first one-way switching device 63, and the second fluid port 11F2 is connected to a gas supply device 6 through the second one-way switching device 64.

When the gas supply device 6 is configured to supply the external gas, the first one-way switching device 63 (e.g., the one-way valve) is open. That is, the external gas can only be supplied to the test space TS of the wafer test cassette 1G by the gas supply device 6. In this case, the second one-way switching device 64 (e.g., the one-way valve) is closed.

When the test space TS is depressurized, i.e., the gas is released from the test space TS, the first one-way switching device 63 (e.g., the one-way valve) is closed and the second one-way switching device 64 is open. In this case, the gas in the test space TS can be released into the gas supply device 6.

It should be noted that the present disclosure does not limit the numbers of the first fluid port and the second fluid port and the arrangement thereof, and the embodiment described herein merely an example, and is not meant to limit the scope of the present disclosure.

Figure 9:
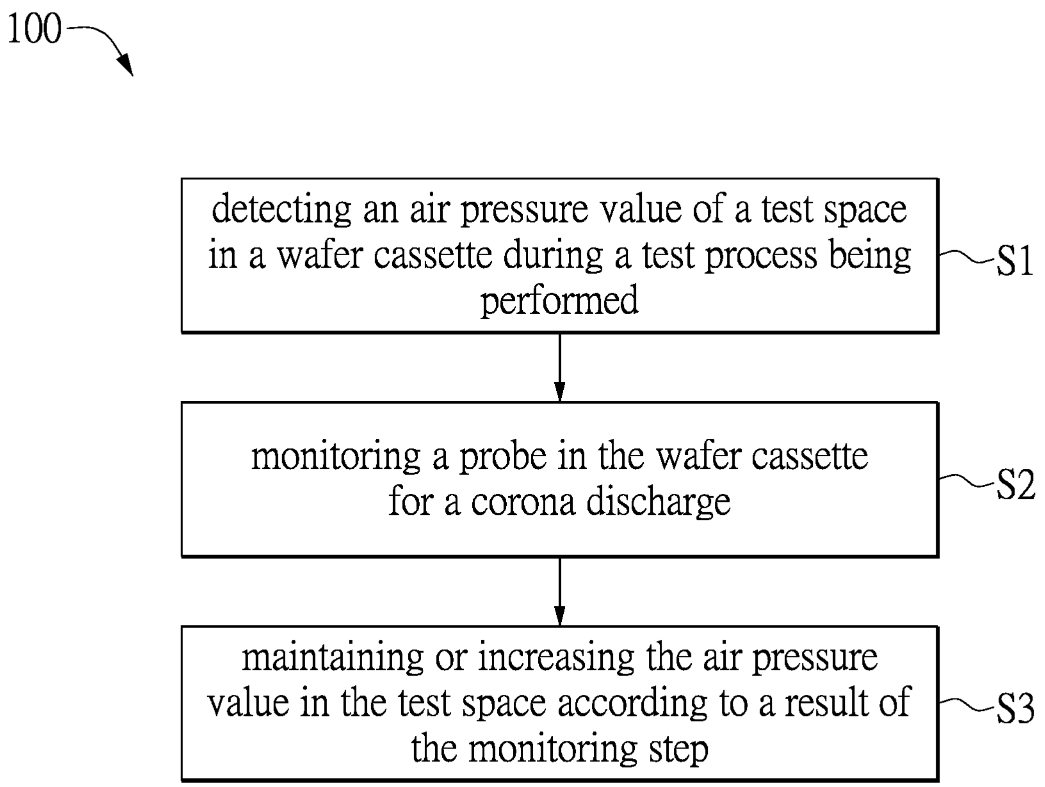
FIG. 9 is a flowchart of a wafer test method according to an embodiment of the present disclosure.

Referring to FIG. 9, FIG. 9 is a flowchart of a wafer test method according to an embodiment of the present disclosure. A wafer test method 100 includes a detection step S1, a monitoring step S2, and a control step S3. In the detection step S1, an air pressure value of a test space in a wafer test cassette during a test process being performed is detected. In the monitoring step S2, a probe in the wafer test cassette is monitored for a corona discharge. In the control step S3, the air pressure value in the test space is maintained or increased according to a result of the monitoring step S2.

When the test process in the wafer test cassette is performed at high voltage, the corona discharge may easily occur between the probes. Therefore, the detection step S1, the monitoring step S2, and the control step S3 are performed to solve the problems of the corona discharge generated between the probes. Specifically, in the present disclosure, when the testing is performed at the high voltage, the gas is introduced into the test space to increase the air pressure in the test space, such that the corona discharge can be suppressed. If the corona discharge on the probes is still detected, it can be realized that the air pressure value in the test space is not high enough. Therefore, the corona discharge on the probes can be suppressed by further increasing the air pressure, e.g., injecting the external gas to increase the air pressure value of the test space. If no corona discharge is detected on the probes, it can be realized that the air pressure of the test space is suitable for the current voltage for the wafer test through the probes. In this case, the air pressure in the test space is maintained. In certain embodiments, if the corona discharge is detected on the probes, the magnetic attraction between the first housing and the second housing of the wafer test cassette, such as the wafer test cassette in the first embodiment, can be enhanced, and the air pressure value of the test space can be further increased.

Beneficial Effects of the Embodiments

In conclusion, in the wafer test cassette, the wafer test system, and the wafer test method provided by the present disclosure, by virtue of adjusting the magnetic attraction and increasing the air pressure of the injected inert gas (in particular, increasing the air pressure in the wafer test cassette to more than or even a number of times the external air pressure), the corona discharge occurrence in the test process can be significantly reduced so as to minimize damage to the probes, thereby reducing test costs.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A wafer test cassette, comprising:

a first housing including a first magnetic member;

a second housing including a second magnetic member, the second magnetic member being arranged corresponding to the first magnetic member so as to enable the first housing and the second housing to be tightly coupled to each other by which a test space is defined, a magnetic shielding assembly movably disposed in the second housing;

wherein the first housing includes a probe card including at least one probe, and the second housing is configured to carry a wafer; wherein, when the first housing and the second housing are coupled to each other, the at least one probe is configured to be in contact with at least one pad of the wafer;

a first fluid port disposed on the first housing or the second housing, and configured to receive an external gas to the test space; and a gas supply device having a first fluid path connected to the first fluid port, the gas supply device being configured to supply the external gas to the test space through the first fluid path;

wherein after the test space receives the external gas, an air pressure value of the test space is greater than an atmospheric pressure outside the wafer test cassette;

wherein a shielding assembly includes a pair of recess that corresponds to the second magnetic member, wherein when the shielding assembly moves to cover the second magnetic member, the recess accommodates the second magnetic member.

2. The wafer test cassette according to claim 1, wherein the external gas includes an inert gas.

3. The wafer test cassette according to claim 1, wherein a magnetic attraction between the first magnetic member and the second magnetic member is determined according to the air pressure value of the test space.

4. The wafer test cassette according to claim 3, wherein one of the first magnetic member and the second magnetic member is a non-permanent magnet, the magnetic attraction between the first magnetic member and the second magnetic member increases with an increase of the air pressure value, such that a pin pressure caused by an electrical contact between the at least one probe and the at least one pad of the wafer is unchanged.

5. The wafer test cassette according to claim 1, further comprising a switching device disposed between the first fluid port and the gas supply device; wherein the switching device is configured to enable the external gas to enter the test space or release from the test space through the first fluid path.

6. The wafer test cassette according to claim 5, further comprising a second fluid port disposed on the first housing or the second housing and connected to the gas supply device; wherein the second fluid port is configured to enable the external gas to enter the test space or release from the test space.

7. The wafer test cassette according to claim 6, wherein the gas supply device has a second fluid path connected to the second fluid port.

8. The wafer test cassette according to claim 6, wherein each of the first fluid port and the second fluid port is configured to enable the external gas to enter the test space or release from the test space, or one of the first fluid port and the second fluid port is configured to enable the external gas to enter the test space and another of the first fluid port and the second fluid port is configured to enable the external gas to release from the test space.

9. The wafer test cassette according to claim 1, wherein after a test process is performed by applying the probe card of the wafer test cassette to test the wafer, the external gas is configured to be released, and the first housing and the second housing are released from a tightly coupled state.

10. The wafer test cassette according to claim 1, further comprising a seal member disposed between the first housing and the second housing and arranged around the test space.

11. A wafer test system, comprising:

the wafer test cassette as claimed in claim 1;

a discharge transducer disposed at a side of the first housing or a side of the second housing, and configured to detect whether or not a corona discharge occurs on the at least one probe; and a pressure transducer configured to detect the air pressure value of the test space.

12. The wafer test system according to claim 11, further comprising a control circuit correspondingly connected to the discharge transducer and the pressure transducer.

13. A wafer test method, comprising:

a detection step of detecting an air pressure value of a test space in a wafer test cassette as claimed in claim 1 during a test process being performed;

a monitoring step of monitoring a probe in the wafer test cassette for a corona discharge; and a control step of maintaining or increasing the air pressure value in the test space according to a result of the monitoring step.

* * * * *